United States Patent [19]

Vice

[11] Patent Number: 5,799,248
[45] Date of Patent: Aug. 25, 1998

[54] QUASI-DOUBLE BALANCED PASSIVE REFLECTION FET MIXER

[75] Inventor: Michael W. Vice, El Granada, Calif.

[73] Assignee: Watkins-Johnson Company, Palo Alto, Calif.

[21] Appl. No.: 575,409

[22] Filed: Dec. 20, 1995

[51] Int. Cl.$^6$ .................................................. H04B 1/28
[52] U.S. Cl. .......................... 455/333; 455/326; 327/116; 327/119
[58] Field of Search .................... 455/323, 326, 455/333, 313, 330; 327/116, 119, 355

[56] References Cited

U.S. PATENT DOCUMENTS

| | | | |
|---|---|---|---|
| 3,700,928 | 10/1972 | Milberger et al. | 307/268 |
| 4,500,847 | 2/1985 | Hallford | 330/277 |
| 4,502,028 | 2/1985 | Leake | 333/109 |
| 4,675,911 | 6/1987 | Gertz | 404/6 |
| 4,979,233 | 12/1990 | Kawahata | 455/330 |
| 5,027,163 | 6/1991 | Dobrovolny | 455/326 |
| 5,060,298 | 10/1991 | Waugh et al. | 455/326 |
| 5,130,678 | 7/1992 | Edwards | 333/24 |
| 5,280,648 | 1/1994 | Dobroovolny | 455/326 |
| 5,361,409 | 11/1994 | Vice | 455/326 |
| 5,602,501 | 2/1997 | Shiga | 327/105 |

Primary Examiner—Reinhard J. Eisenzopf
Assistant Examiner—Darnell R. Armstrong
Attorney, Agent, or Firm—Flehr Hohbach Test Albritton & Herbert LLP; Aldo J. Test; R. Michael Ananian

[57] ABSTRACT

FET mixers requiring relatively low local oscillator power levels and having excellent isolation of the local oscillator signal relative to the radio and intermediate frequency signal. The mixer comprises a first and second FET transistor (Q1, Q2) having their gates and sources connected together such that the first and second FET transistors are in series; a local oscillator input circuit; a coupling network comprising a transmission line balun; a diplexer circuit; and a bias circuit. In one aspect, the transmission line balun divides the voltage of an incident traveling wave equally between the first and second transmission line components, and sums the currents of traveling waves generated by the transmission line components to generate an exitant traveling wave signal. The RF signal is completely reflected by each the FET transistors with no phase shift when they are nonconducting (OFF), and completely reflected by each of the FET transistors with a 180° phase shift when they are conducting (ON) owing to the different relative impedances. A diplexer circuit separates an intermediate frequency signal from the exitant traveling wave signal, and substantially all of said RF signal incident on the first and second FETs is reflected from the FETs during ON and OFF conduction state such that commutation of the RF signal during each half cycle of the local oscillator signal is symmetrical, and such that the RF reflected signal components in the reflected wave are substantially canceled from the exitant traveling wave to generate the intermediate-frequency (IF) signal.

24 Claims, 7 Drawing Sheets

QUASI-DOUBLE BALANCED PASSIVE REFLECTION FET MIXER

BACKGROUND OF THE INVENTION

1. Field of the Invention

The invention relates generally to radio frequency communication devices and more specifically to passive transmission FET mixers requiring relatively low local oscillator power levels and having excellent isolation of the local oscillator signal relative to the radio and intermediate frequency signals.

2. Description of the Prior Art

The dynamic range of many prior art microwave frontends is controlled by the single and two-tone intermodulation levels of a Schottky diode mixer. (S. Weiner, D. Neuf, S. Spohrer, "2 to 8 GHZ Double Balanced MESFET Mixer With +30 dBm Input 3rd Order Intercept," 1988 *IEEE MTT-S Digest*, pp.1097–1099.) A typical Schottky mixer obtains third order intercept points approximately equal to the local oscillator (LO) power minus the conversion loss plus 10-dB. The diode-ring double-balanced mixer often requires the LO power to exceed the signal compression level by 6-dB. Trade-offs between LO power levels and third order intercept and one dBm compression points are inevitable, even in multiple diode schemes attempting to improve isolation, bandwidth, and single-tone intermodulation levels.

Low distortion mixing is known to be possible with small amounts of LO power when an unbiased channel of a GaAs MESFET is used as the mixing element. (See, Stephen A. Maas, "A GaAs MESFET Balanced Mixer With Very Low Intermodulation," 1987 *IEEE MTT-S Digest*. pp.895–896.) Weiner, et al., describe both single and double balanced mixers that use GaAs MESFETs instead of diodes. These mixers typically operate over a two to eight GHz range and obtain third order intercepts greater than +28 dBm at an LO power input of +23 dBm, with typical conversion loss of 8-dB, and an LO to radio frequency (RF) isolation greater than 25-dB. Weiner, et al., explain that previous designs using MESFETs had been limited by the LO balun and intermediate frequency (IF) transformer. These limitations were overcome by using a ring of GaAs MESFETs and tapered micro strip baluns in single and double balanced configurations to achieve multi-octave bandwidths. However, the bandwidth of these units is limited by the MESFET package parasitic reactances used in the ring. Weiner, et al., indicate that their future experiments will include a monolithic quad-MESFET with special gate geometry designed to improve the third order distortion, and wire-bonding of the FET to an alumina substrate to minimize parasitic reactances.

The Siliconix Si8901-DBM is a monolithic quad-MOSFET ring demodulator/mixer that is reported to achieve third-order intercepts exceeding +37 dBm and 2-dB signal overload compression and desensitization of +30 dBm at a LO drive level of +17 dBm (50 mW). (Ed Oxner, "High Dynamic Range Mixing With The Si8901," *March 1988*, pp.10–11.) The Si8901 commutation-mixer relies on the switching action of the quad-MOSFET elements to effect a mixing action. The MOSFETs act, essentially, as a pair of switches reversing the phase of a signal at a rate determined by the LO frequency. The MOSFETs exhibit a finite on-resistance that is expressed as a conversion efficiency loss. The loss results from the $r_{ds(on)}$ of the MOSFETs relative to both the signal and IF impedances and signal conversion to unwanted frequencies.

SUMMARY OF THIS INVENTION

Briefly, the present invention comprises a quasi-double balanced passive reflection FET mixer that operates with reduced levels of nonlinearity and intermodulation distortion as the result of the topological structure and the application of a dc bias to FET channels used for mixing which is useful for both up- and down-frequency conversion of non-overlapping RF and IF signal frequencies.

It is therefore an object of the present invention to produce a radio frequency mixer that has a wide dynamic range of operation and low overall signal distortion including low intermodulation distortion and partial cancellation of non-linearity distortion imposed on the radio frequency signal. These and other features and advantages of the present invention will no doubt become clear to those of ordinary skill in the art after having read the following detailed description of the preferred embodiments which are illustrated in the various drawing figures.

DETAILED DESCRIPTION OF THE PREFERRED EMBODIMENTS

Figure 1:
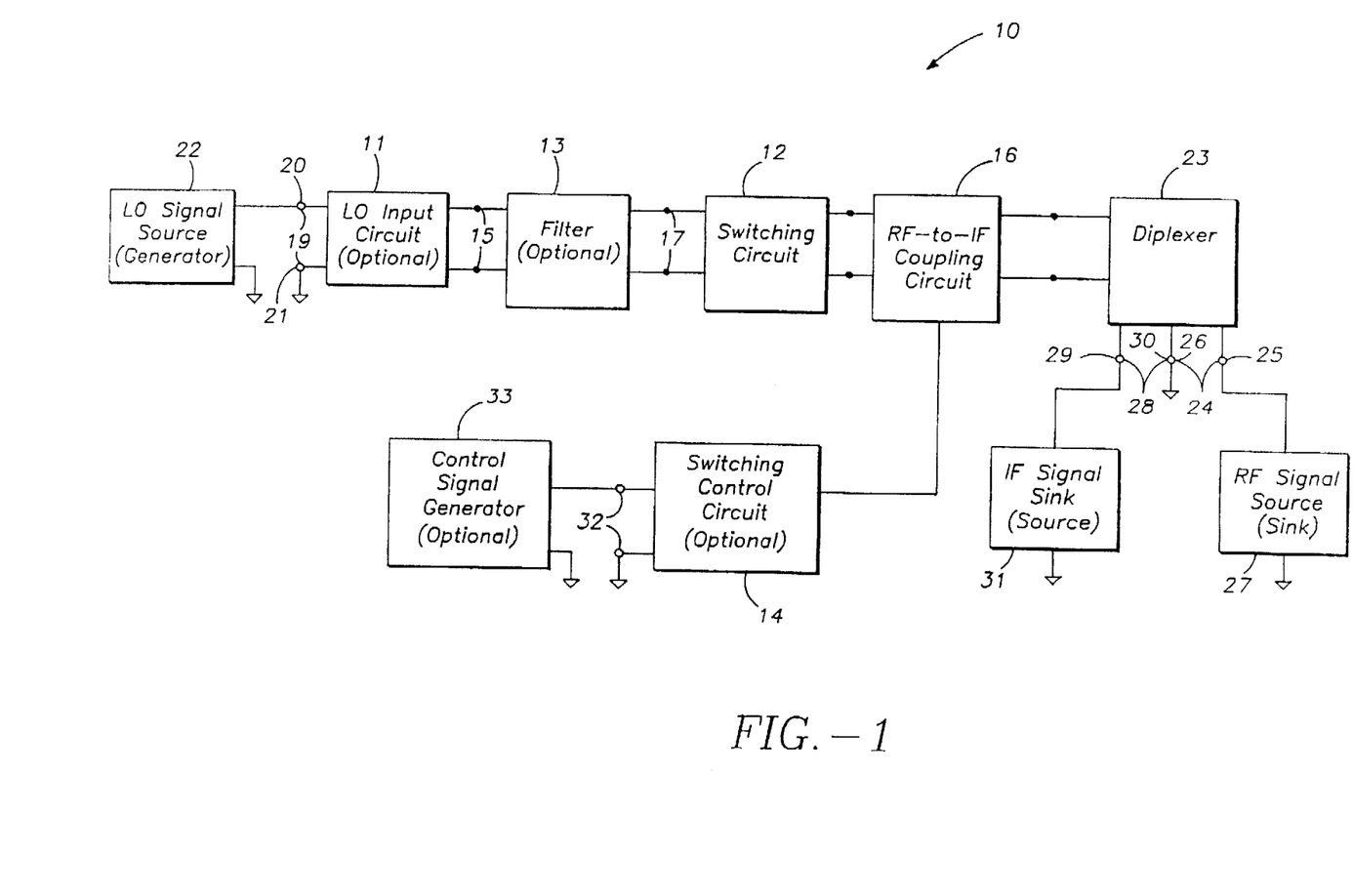
FIG. 1 is a block diagram of an embodiment of the quasi-double balanced mixer of the present invention.

In reference to FIG. 1, there is shown an embodiment of the quasi-double balanced mixer 10 of the present invention. Mixer 10 comprises a local oscillator (LO) input circuit 11, a switching circuit 12 coupled to local oscillator circuit 11 via filter circuit 13 ( a D.C. blocking circuit in the preferred embodiment), a switching circuit control circuit 14 coupled to and provided for controlling the switching of the switching circuit 12, a radio frequency (RF) port to intermediate frequency (IF) port coupling circuit 16 (an RF-to-IF Balun circuit in the preferred embodiment) connected to the switching circuit 12, and a diplexer circuit 23 coupled between the RF-to-IF coupling circuit 16 and RF port 24 and IF port 28. Switching circuit 12 acts as the LO/RF or LO/IF signal mixer by creating a time varying impedance that varies in response to the applied LO signal.

A two-terminal local oscillator port 19 having a pin terminal 20 and a ground terminal 21 is provided for coupling an external local oscillator signal source 22 to the local oscillator input circuit 11. A two-terminal radio frequency (RF) port 24 having a pin terminal 25 and a ground terminal 26 is provided for coupling an external radio frequency signal source (or sink) 27 to the RF-to-IF coupling circuit 16 via diplexer circuit 23. A two-terminal intermediate frequency (IF) port 28 having a pin terminal 29 and a ground terminal 30 is provided for coupling an external intermediate frequency signal load/sink (or source) 31 to RF-to-IF coupling circuit 16 via diplexer 23. Control circuit 14 may optionally be provided with a control circuit input port 32 for coupling the control circuit to an external control signal generator 33.

Switching circuit 12 is a three port device having a LO signal input port 17 for receiving the LO signal which functions to operate the switch, and first and second ports coupled to the RF and IF ports 24, 28 through the RF-to-IF (IF-to-RF) coupling circuit 16 and diplexer circuit 23. The switching circuit responds to the applied LO signal by turning ON and OFF at the LO signal frequency, thereby causing a rapid time-varying change in resistance of the switching elements.

Unbalanced diplexer circuit 23 functions to filter and separate the IF from the RF signals during either up-frequency conversion in which an IF signal is applied (source) and an RF signal is extracted (sink or load) or down-frequency conversion in which an RF signal is applied (source) and the IF signal is extracted (sink or load). RF-to-IF (IF-toe RF) coupling circuit 16 functions to prevent LO signals from appearing at the RF and IF ports, and to transform the RF and IF signal impedance.

Figure 2:
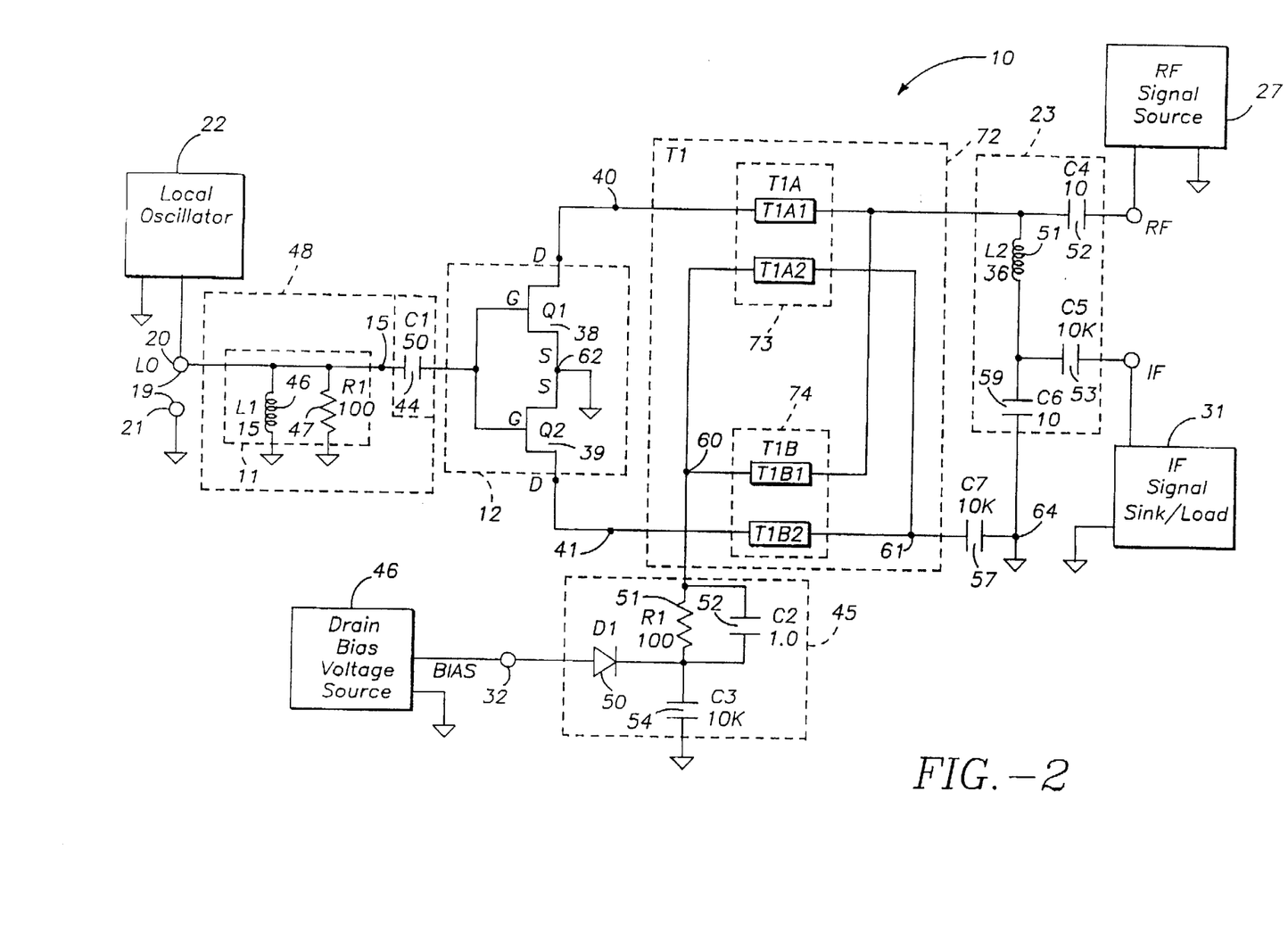
FIG. 2 is a schematic diagram of a preferred embodiment of the quasi-double balanced mixer of the present invention.

FIG. 2 is an illustration of a preferred embodiment of the quasi-double balanced mixer shown in functional block diagram form in FIG. 1. The term "quasi-double balanced" is used in describing the inventive mixer 10 because the inventive mixer 10 resembles a double balanced mixer in that both RF and IF ports are balanced via coupling circuit 16, and resembles a single balanced mixer in that RF and IF signals must be non-overlapping in frequency. This embodiment nominally operates over a LO/RF frequency range of from about 800 MHz to about 1000 MHz, but there are no absolute limits to the useful frequency range of the inventive mixer. Furthermore, the illustrated embodiment of the mixer nominally operates with a LO drive of about +17 dBm and about a +5 Volt drain bias voltage. The gate terminals are self biasing at about −2 volts.

In reference to the embodiment illustrated in FIG. 2, switching device 12 is realized with a pair Q1 38 and Q2 39 of interconnected field-effect transistors (FETs), each FET having a control or gate (G) terminal, as well as drain (D) and source (S) terminals. The source terminal of Q1 is connected to the source terminal of Q2. The FET-pair switching device 12 is responsible for mixing the local oscillator (LO) signal coupled to the FET switch by the LO input circuit 11 with the radio frequency (RF) signal coupled to the FET switch by the RF-to-IF coupling circuit 16 and Diplexer Circuit 23 to generate an intermediate frequency (IF) signal. Because this FET-pair (Q1-Q2) is at the heart of the signal mixing action and couples to the LO, RF, and IF functional components of the mixer circuit 10, the structure and operation of mixer 10 are described relative to the FET-pair Q1 38 and Q2 39. FET pair Q1-Q2 provides a single switching operation between circuit nodes 40 and 41, each of which nodes corresponds to a drain terminal of one of the FETs. In this embodiment, both interconnected FET source terminals are connected to ground.

In general, signal propagation through a FET junction has a perturbing effect on FET admittance (or resistance) which results in FET output signal distortion, particularly signal intermodulation distortion when the FET is used as a signal mixing means. Therefore, reducing the admittance (resistance) perturbing effect reduces distortion and improves overall mixer performance. In the present invention, implementing the signal switching function with a FET-pair rather than with a single FET reduces the perturbing effect on admittance as described hereinafter, and results in reduced distortion.

For operation as a frequency down converter where LO and RF signal are input and the IF signal is generated as an output and applied to an IF load, the RF signals are forced to pass through both FETs (Q1 38 and Q2 39) in such a way that the RF signal enters the drain of one FET (Q1) at circuit node 40 emerges from the source terminal of the same FET (Q1) at circuit node 62, then enters the source terminal of the second FET (Q2) and emerges from the drain of the second FET (Q2) at circuit node 41. In this circuit, propagation of the RF signal through the first FET (Q1) drain-to-source may perturb the admittance of the FET with the resulting effect on the signal, but for FETs (Q1 and Q2) of comparable construction, propagation through the second FET (Q2) source-to-drain has an opposite perturbing effect on the admittance of Q2 as compared to the effect on Q1. The net effect of propagation of the signal through both serially connected (source-to-source) FETs Q1 and Q2 is cancellation of some of the distortion, including an appreciable amount of intermodulation distortion.

The FETs operate with a gate bias voltage Vg applied by gate bias circuit 48 between the gate and source terminals and a drain bias voltage Vd applied by drain bias circuit 45 between the drain and source terminals. The drain bias voltage is generated by an external drain bias voltage source 46, while the gate terminals of the FETs are self biased.

Figure 3:
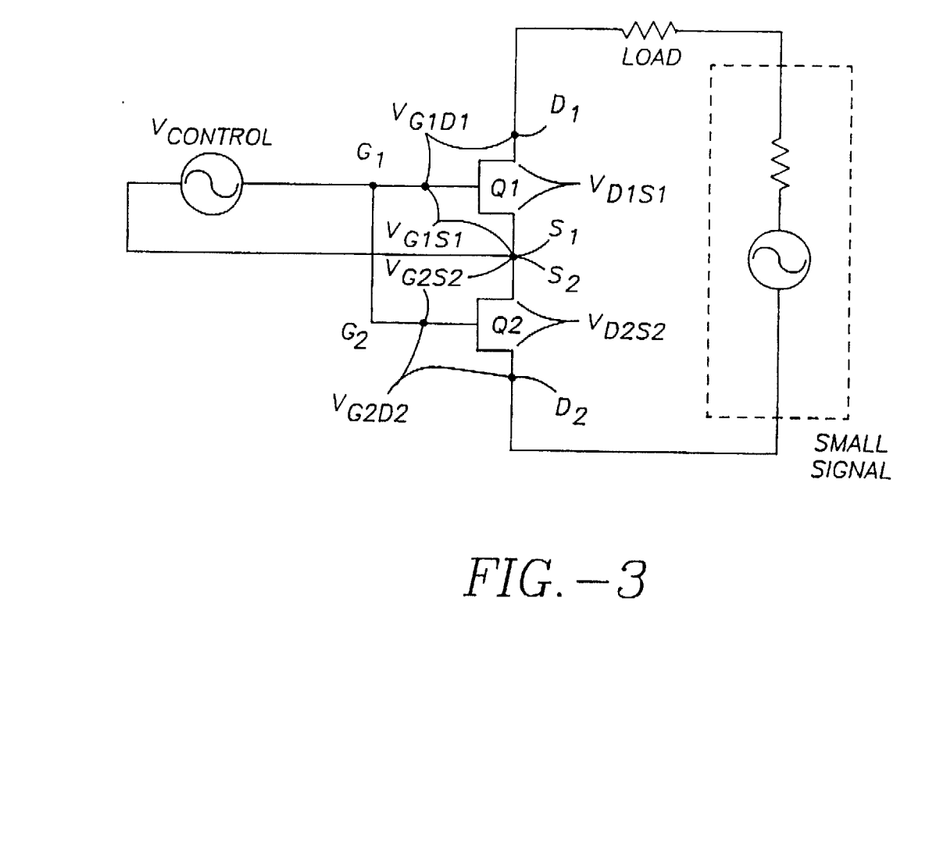
FIG. 3 is a schematic of a pair of back-to-back FETs used as a model to explain how the present invention reduces intermodulation distortion in the preferred embodiment.

The theoretical basis for this distortion cancellation is now described with reference to FIG. 3 which shows a pair of serially connected FETS. The serially connected FET-pair structure, and application of drain bias to the channels of the FET transistors significantly reduce the intermodulation distortion in the mixer output signal. FIG. 3 is a simplified circuit which illustrates how the back-to-back connected FETs (Q1-Q2) cancels intermodulation distortion.

The gate-to-source voltage ($V_{GS}$) is equal to the sum of the gate-to-drain voltage ($V_{GD}$) and the drain-to-source voltage ($V_{DS}$).

$$V_{GS} = V_{GD} + V_{DS}$$

Let $V_{GS}$ be fixed, set by a fixed voltage source for example, then:

$$0 = \Delta V_{GD} + \Delta V_{DS}$$
$$\Delta R_{DS} \simeq C \Delta V_{GD}, \text{ where } C \text{ is a constant.}$$
$$\simeq -C \Delta V_{DS}$$

where $\Delta R_{DS}$ is the change in resistance between the FET drain and source terminals. The change in resistance between the two FET drains ($\Delta R_{D1D2}$) is equal to the change of resistance between the source and drain of the first FET Q1 ($\Delta R_{D1S1}$) and the change of resistance between the source and drain of the second FET Q2 ($\Delta R_{D2S2}$).

$$\Delta R_{D1D2} = \Delta R_{D1S1} + \Delta R_{D2S2},$$
$$= -C(\Delta V_{D1S1} + \Delta V_{D2S2})$$

To a first approximation, the voltage $V_{D1D2}$ is symmetrically dropped across both FETS Q1 and Q2, so that:

$V_{D1S1} = -V_{D2S2}$ (approximately).

Therefore, it follows that the change in resistance between the two FET drains is approximately zero:

$\Delta R_{D1D2} \equiv 0$.

This result corresponds to complete distortion cancellation under the indicated approximations. To the extent that the approximations may not hold precisely, distortion is still reduced to a low level.

This result shows that for serially connected (e.g. source-to-source) FETs, the change in resistance between the FET pair Q1-Q2 drain terminals is zero. The small signal shown in FIG. 3, corresponding to the RF signal in mixer circuit 10, passes through the FET channel combination of Q1 and Q2 without controlling the overall resistance of the FET channel combination. This condition is equivalent to infinite intermodulation suppression. Under actual operating conditions, where the assumed conditions may not hold entirely true, the intermodulation distortion is reduced to a low level.

Having described the benefits of the serially connected FET pair, the LO input circuit 11 which pumps the FET pair to cause the switch action and a time-varying impedance change is now described. (Nominal circuit component values are indicated parenthetically for the circuit of the illustrated embodiment following the component name and reference numeral.) FET pair Q1-Q2 is pumped by LO circuit 11 comprising inductor L1 46 (15 nH), resistor R1 47 (100 ohm), and capacitor C1 44 (50 pF) which may alternatively be considered a component of filter 13 rather than as a component of LO input circuit 11. Inductor L1 46 and resistor R1 47 are connected in parallel with each other across the LO input port 19 and therefore in parallel with the external oscillator source 22, while capacitor C1 44 is serially connected between the local oscillator source 22 and the gate terminals of the FET-pair. Inductor L1, capacitor C1, and resistor R1 also for the gate bias circuit 48 as described.

Intrinsic gate capacitances of the FET transistors Q1 and Q2 ($C_{gQ1}$ and $C_{gQ2}$) are tuned to an open circuit with inductor L1 46. Resistor R1 47 provides the necessary matching load impedance to the local oscillator input port 19. Capacitor C1 44 is a dc blocking capacitor which allows the gates of FET-pair Q1-Q2 to self bias at about −2 volts.

RF port 24 and IF port 28 are coupled to mixer 10 through an unbalanced diplexer circuit 23 comprising inductor L2 51 (36 nh), capacitor C4 52 (10 pF), and capacitor C5 53 (10 kpF). The unbalanced diplexer circuit 23 is then coupled to the balanced FET-pair switching circuit comprising FETS Q1-Q2 via transmission line balun T1 72 (comprising T1A 73 and T1B 74). Balun T1 72 acts to prevent LO frequency signals appearing at the FET drain terminals of Q1 and Q2 from coupling to the RF and/or IF ports. LO signal coupling to the RF and/or IF ports is prevented because equal LO voltages at circuit nodes 40, 41 cancel at node 63 by the symmetry of balun T1.

Balun T1 72 also acts to transform the RF input signal impedance from about 50 ohms to about 200 ohms. The mixing FETs provide a more ideal short circuit to a 200 ohm system than to a 50 ohm system so that the conversion efficiency is improved. The mismatched impedance results in reflection of the signal, and the reflected signal is then transformed in reverse propagation from the FET drains through balun T1 into 50 ohms. Mixer 10 operates as a passive reflection mixer even though balun T1 72 does not operate as reflection transformer.

Intermodulation distortion is significantly reduced by the application of a dc drain bias voltage to the channels of mixing FETs Q1 and Q2. External bias voltage (+5V) is applied to bias port 32 and processed through drain bias circuit 45 comprising optional diode D1 50, and resistor R2 51, capacitor C2 52, and capacitor C3 54. Capacitors C4 52, C5 53, C6 59, and C7 57 provide dc blocking (among other functions) so as to force bias current through the FETs.

Diode D1 50 provides reverse bias protection and is optionally provided in the mixer circuit 10. Resistor R2 51 (100 ohms) provides current limiting to while the combination of resistor R2 51 and capacitor C2 52 work together with balun T1 72 to provide the appropriate RF impedance to the drains of the FETs. Capacitor C3 54 provides ac isolation of bias port 32 from other components of mixer circuit 10. The drain bias circuit 45 feeds the center tap node 60 of balun T1 72 which in turn supplies drain bias current to the FET-pair drain terminals.

A dc drain bias voltage is generated by dc drain bias circuit 45 and applied to the channels of the mixing FETs (Q1, Q2) at each FET drain terminal. This drain bias voltage to the FET pairs significantly reduces intermodulation distortion in the output signal. Drain bias circuit 45 is connected to an external dc bias voltage source 46 at drain bias port 32. Scaling resistor R2 (100 ohm) 51 serves to scale the bias voltage that appears at the drain terminal of each FET transistor (Q1, Q2), and to limit the bias current through each FET. The combination R2 51 and C2 52 provide the bias source circuit with the proper RF impedance. Optional diode D1 50 provides reverse bias protection. Capacitor C3 54 provides ac isolation of the bias port 32 from the other mixer components. The drain bias voltage is coupled to each FET drain terminal through resistor R2 to circuit node 60 and through baluns T1A 73 and T1B 74 to the FET drain.

Significantly, balun T1 72 provides a dc path for the drain bias current. For example, bias for Q2 flows from the output of resistor R2 51, into balun wire T1A2 at circuit node 60, into balun wire T1B2 at circuit node 61, into the drain terminal of Q2 at node 41, out the source terminal of Q2, and to ground at circuit node 62. Bias for Q1 flows from the output of resistor R2 51, into balun T1B1 at circuit node 60, into balun T1A1 at circuit node 63, into the drain terminal of Q1 at node 40, and, out the source terminal of Q1, at node 62 to ground.

Application of the drain bias to the FETs also advantageously causes each FET to function as a LO signal amplifier. When a drain bias voltage is applied to the FET drain terminals, and the LO signal is applied to the connected gate terminals of the paired FETs, a LO response signal appearing much like an amplified version of the gate terminal LO signal is generated within the FET structure and appears at each conducting FET drain terminal. The appearance of this drain LO response signal enhances the switching behavior of the FET. The applied LO signal and the response LO signal generated within the FET junction work together in a compound fashion so that, in essence, each FET sees a larger LO driving signal than the LO signal applied at the gate alone. Therefore, the FET switches operate with a lower externally applied LO signal.

The gate terminal is self-biased so that no explicit gate bias supply is needed. Gate bias voltage is generated for the FET pair (Q1-Q2) 38, 39 by coupling capacitor C1 44, which functions as a dc current blocking capacitor, between the LO input circuit 11 and FET-pair Q1 and Q2 gate terminals. Each of FETS Q1 and Q2 attains to a self bias level of about −2 volts by the charging of capacitor C1 44 during forward conduction of the FET gate junctions. Eliminating an explicit bias source for the gate is advantageous because such implementation reduces cost by eliminate some components, and eliminates the inconvenience of having to provide the separate bias source. Provision of self-biasing circuitry does not preclude application of a separate external gate bias if additional flexibility is desired for tuning the behavior of the mixer circuit 10.

Pin terminal 71 and ground terminal 72 of RF input port 24 are coupled to the mixer switching FETS Q1 38 and Q2 39 via balun T1 72. Pin terminal 78 and ground terminal 79 of IF input port 28 are also coupled to the mixer switching device FETS via balun T1. In the preferred embodiment, balun T1 comprises a pair of 100 ohm transmission line bifilar wires.

The RF and IF ports 24, 28 are coupled to each other via balun T1 transformers 73, 74 in such a fashion that (for example) during frequency down-conversion, and in conjunction with a LO signal applied to the FET switches 38, 39, RF signal input energy flows from the RF port 24 (source) to the IF port 28 (sink). Each part of transmission line balun T1 participates in the conveyance of energy during each and every LO signal half cycle.

The energy (current) flow is achieved by providing direct electrical connections between appropriate circuit components (as shown and described) and by exciting modes in the transmission line balun T1 that have appropriate propagation modes. The RF to IF coupling circuit 16 includes an input port having first 42 and second 43 primary-port terminals, and first 40 and second 41 secondary port terminals. The terms primary and secondary are selected because in a sense both ports of the coupling network serve as both "input" and "output" terminals depending on which signal is of concern.

Further in reference to FIG. 2, RF port pin terminal 25 is connected to capacitor C4 52 (10 pF) which in turn is connected to balun T1 (T1A1 73) at circuit node 63. The serial combination of inductor L2 51 (36 nH) and capacitor C6 59 (10 pF) is also connected from circuit node 63 to the RF port ground terminal 64 (a terminal shared with the IF port 28). Capacitor C7 57 (10K pF) is connected between the RF port ground terminal 64 and balun T1 (T1B2). The IF port pin terminal 29 is coupled to the common circuit node of the serial combination of L2 51 and C6 59, via dc blocking capacitor C5 53.

Balun T1 72 is coupled between circuit nodes 61 and 62 and the FET drains at nodes 40 and 41. More specifically, T1A1 is directly electrically connected between node 63 and node 40, balun T1B2 is directly electrically connected between node 61 and node 41, and the serial combination of balun sections T1B1 and T1A2 is directly electrically connected between nodes 61 and 63. At the same time, transformers T1A1 and T1A2 are magnetically coupled and transformers T1B1 and T1B2 are magnetically coupled. This electrical and magnetic coupling acts to prevent LO frequency signals which appear at the FET drain terminals from coupling to the RF and/or IF ports, and to transform the RF input signal to a 200 ohm system so that the mixing FETs Q1-Q2 provide a more ideal short circuit during their conduction phase. Q1 and Q2 are in phase, that is, they are both ON during one half cycle of the LO signal, and both OFF during other LO signal half cycle.

Figure 4:
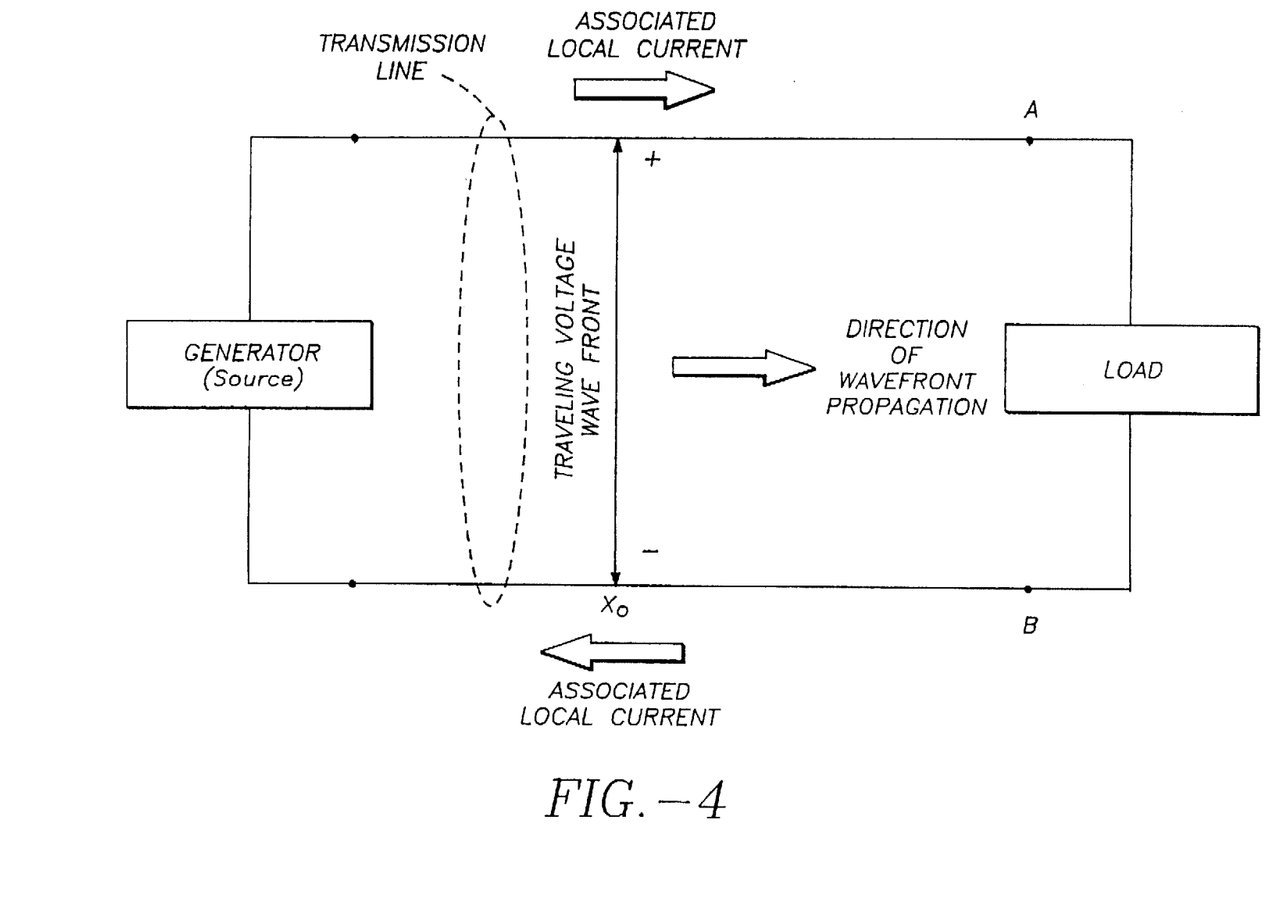
FIG. 4 is a schematic diagram showing propagarion of a wavefront in a transmission line.

In a transmission line, the energy in a wave travels in a single direction (before reflection), in this case from left to right as shown in FIG. 4. The symbol indicating an impedance (e.g. 50 Ω) a direction arrow (e.g. ←) and a polarity (+ −) indicate respectively the impedance, the propagation direction of the traveling wave, and the polarity of the wave relative to the propagation direction. Upon reflection, it courses back on itself. We can say that the reflected wave travels from right to left as shown in FIG. 4. Associated with the wave, there are local values of voltage and current. A voltage appears at any position $X_0$ as a potential difference across the line. Also, a pair of associated local currents (a local current pair) pair exists in the line at $X_0$, where the local currents flow in complementary directions, as shown. When the incident wavefront reaches the load, the wave is partially reflected, resulting in both forward and reflected traveling waves at the load. It is the local current pairs of the forward and reflected waves that flow through the load.

It is therefore ultimately clearer to describe circuit operation by referring to the entire balanced circuit action as a whole. In this context, for a balanced signal that passes simultaneously through both diplexers, the traveling voltage wave reflects from the FETs due to impedance mismatch between the transmission line (≈50Ω) and the FETS ($Z_{FETS, ON}$≈8Ω, $Z_{FETS,OFF}$ 1000Ω). When the FETS are conducting the FET impedance is much less than the line impedance ($Z_{FETS}$<<50Ω) and when the FETS are not conducting, their impedance is much greater that the line impedance ($Z_{FETS}$>>50Ω). The current associated with the local wavefronts of both the incident and reflected waves must flow through $Q_1$, and $Q_2$, since they form current pairs flowing into the load (e.g. at node A) and out of the load (e.g. at node B); hence they flow through the load.

Figure 5:
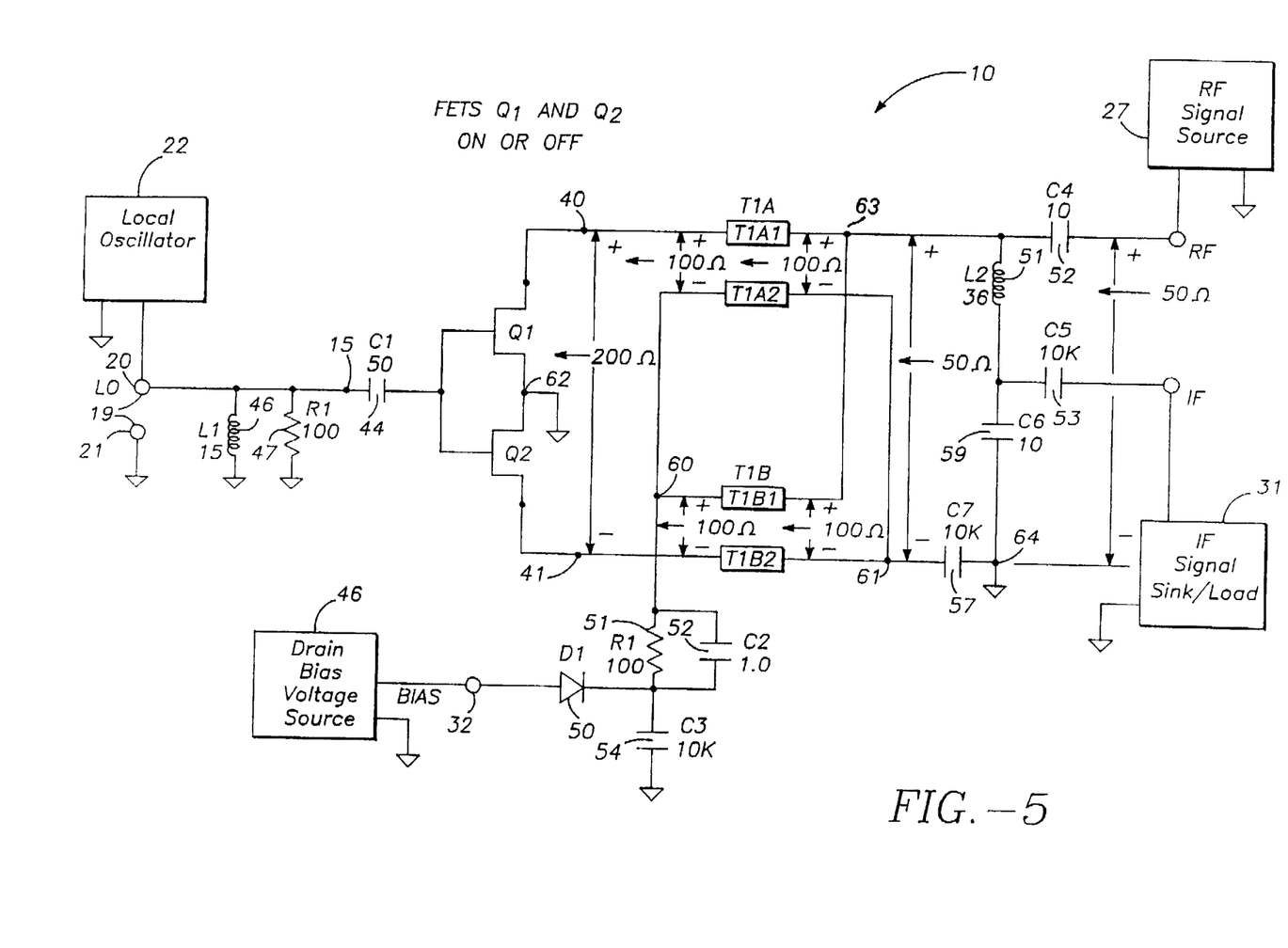
FIG. 5 is a schematic diagram of the embodiment of the invention in FIG. 2 showing the incident wavefront propagation and current flow in the mixer when FETs Q1 and Q2 are conducting (ON) or non-conducting (OFF).
Figure 6:
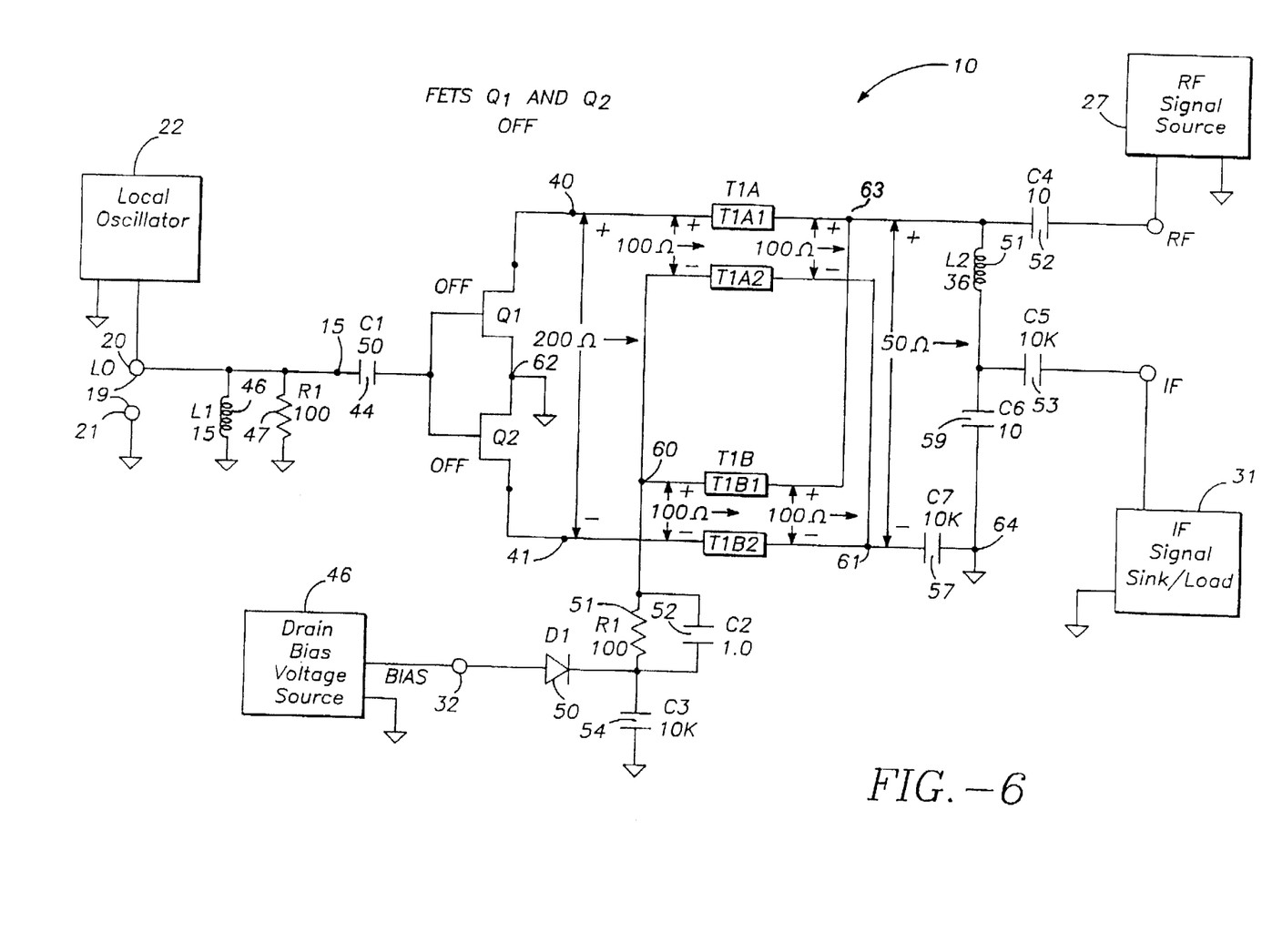
FIG. 6 is a schematic diagram of the embodiment of the invention in FIG. 2 showing the reflected wavefront propagation and current flow in the mixer when FETs Q1 and Q2 are non-conducting (OFF).
Figure 7:
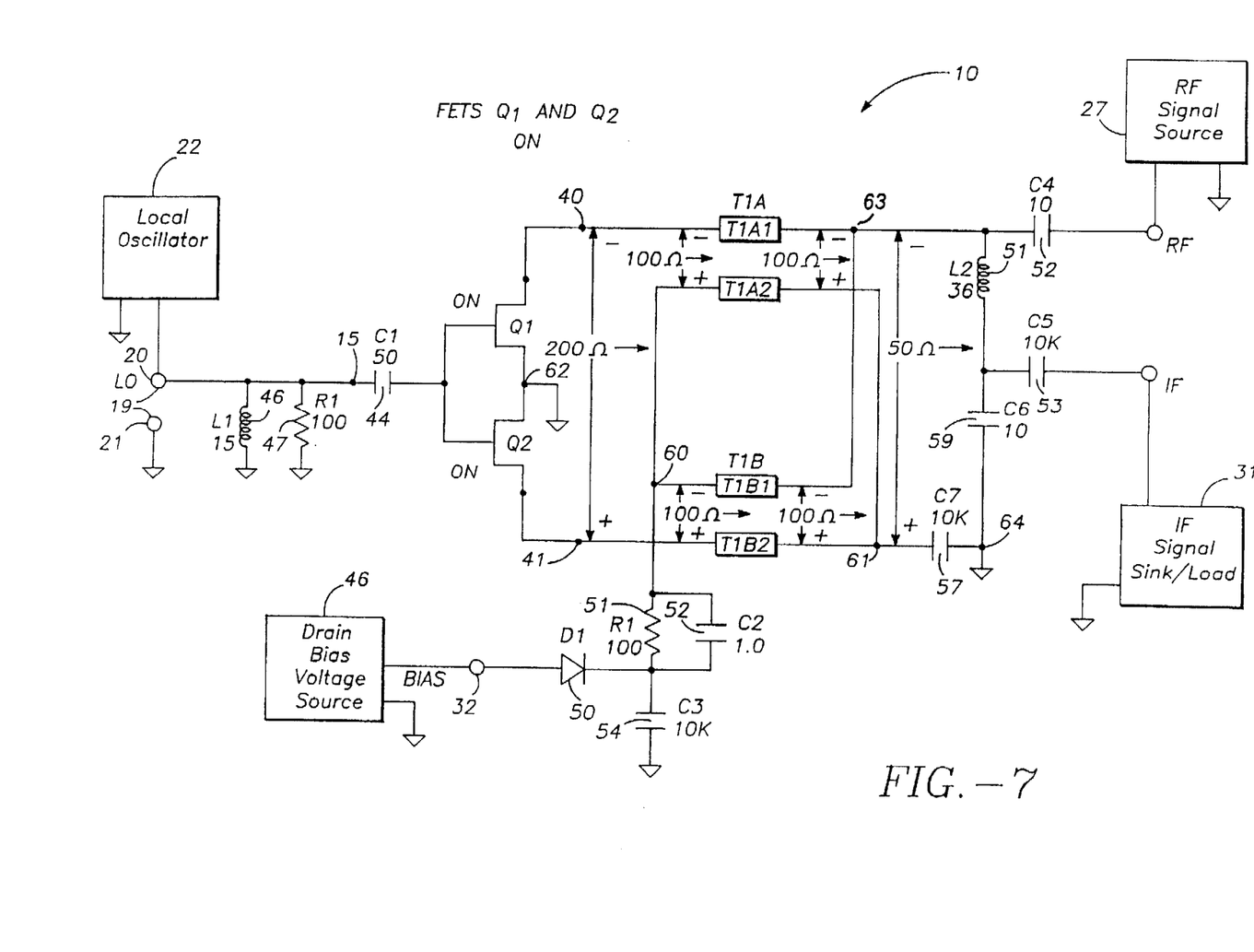
FIG. 7 is a schematic diagram of the embodiment of the invention in FIG. 2 showing the reflected wavefront propagation and current flow in the mixer when FETs Q1 and Q2 are conducting (ON).

In reference to FIGS. 5–7, the LO input signal pumps the FETs and either turns both ON or both OFF. FET transistors Q1 and Q2 do not operate in their linear regions for any significant time and will either be fully ON or fully OFF. FETs Q1 and Q2 present a low impedance (typically about 8 ohms) when conducting (ON) and a very high impedance (greater than 1000 ohms) when not conducting (OFF), and either way they do not present an impedance comparable to the impedance of the baluns (generally about 200 ohms in this embodiment). The mixing function is now described in terms of traveling voltage waves.

In reference to FIG. 5, incident RF voltage at RF-port propagates into mixer 10 in the form of a traveling voltage wave (from right-to-left as shown if FIG. 5) after having passed through diplexer capacitor C4 52 and dc blocking capacitor C7 57. The traveling wave has a characteristic impedance of 50Ω. Current splits equally into two traveling waves traveling down transmission lines T1A and T1B. Since these transmission lines are connected in parallel where the wave enters, the current splits between the two transmission lines. The resulting waves each have a characteristic impedance of 100Ω. The 100Ω waves emerge from the ends (the left ends as shown in FIG. 5) of T1A and T1B where the waves recombine. Since the two transmission lines are connected in series at the point the waves emerge, it is the voltage of these waves that combines, resulting in a characteristic impedance of 200Ω.

Operation of mixer 10 is now described with reference to FIGS. 6 and 7. FIG. 6 pertains to operation when FETs Q1 and Q2 are nonconducting (OFF), while FIG. 7 pertains to operation when FETs Q1 and Q2 are conducting (ON). When Q1 and Q2 are OFF, the 200Ω traveling wave sees a high impedance line termination ($Z_L$>>2000Ω), resulting in nearly complete reflection of energy at the FETs (impedence mismatch and reflection shown symbolically by the dotted line) with no phase shift. The 200Ω reflected wave now travels from left to right (as shown in FIG. 6) and enters T1A and T1B. Since the two transmission lines are connected in series at the point the wave enters the, it is the voltage that splits equally between the lines. Thus, 100Ω waves travel in each of T1A and T1B as shown. The waves emerge from T1A, T1B and recombine. Since the transmission lines are connected in parallel where the waves emerge, it is the current of each wave that combines or sums. This combination results in a 50Ω traveling wave at the diplexer, whose phase is that of the input RF wave (neglecting phase shift across the various transmission lines of the mixer).

With reference to FIG. 7, operation is similar to that described above, except that when the FETS are ON, the FETS have resistance approximately equal to 8Ω and 8Ω<<200Ω. Therefore, nearly all of the incident energy at the FETs is reflected, and the phase of the wave is shifted 180° since load impedance $Z_L$<200Ω. This appears as a voltage polarity reversal in the figures. Furthermore, the traveling wave appearing at the diplexer is now phase shifted relative to the RF input wave by 180° (again neglecting phase shift across the transmission lines in the mixer).

Thus the reflected wave is commutated with each half cycle of the LO signal, and the reflected wave contains LO−RF, and LO+RF frequencies. Since nearly all of the RF input traveling wave is reflected from FETs in each case (FETs ON or OFF), commutation is nearly symmetric, resulting in cancellation of the RF component of the reflected wave. Only the LO−RF or the RF−LO ( whichever gives a positive number) can pass through low pass filter section (L2, C6) of the diplexer. The signal also passes through dc blocking capacitors C5 and C7, and appears at the IF port in the form of a 50Ω output signal.

From the foregoing description, those having ordinary skill in the art, in light of this description will appreciate that the RF-to-IF coupling balun provides at least four benefits. First, the balun T1 72 cooperates with other mixer components to provide the mixing and energy coupling function of the mixer circuit. Secondly, the balun is an important component of the drain bias circuit. Third, it is desirable that current flows through the balun in such a way so as to minimize propagation or coupling of any of the LO signal that has been amplified in the FETs and appears at the FET drains into the RF or IF ports. Fourth, the balun acts to transform the RF input signal impedance to 200 ohms; the mixing FETs provide a much more ideal short circuit to a 200 ohm system, thereby yielding a improvement in conversion efficiency. The reflected IF signal is transformed in reverse propagation (reflection) through the balun to 50 ohms.

Each of the RF and IF ports 24, 28 are band-limited. Mixer 10 operates in the manner described only when the RF and IF signal frequencies are separated and do not overlap. For the component values in the embodiment illustrated in FIG. 2, the typical range of RF frequencies is between about 800 MHZ and about 1000 MHz, and the typical range of IF frequencies is between about 10 MHZ and about 100 MHz, however, other there is no absolute limit to the useful range of signal frequencies in the inventive mixer.

The RF and IF bands are preferably separated by at least about 2 octaves to maintain isolation. Mixer 10 may be used for up-conversion in which case the input energy is injected into the IF port, or it may be used for frequency down-conversion in which case the input energy is injected into the RF port.

Those workers having ordinary skill in the art, in light of the description contained herein, will realize that all of the afore-described currents propagate through the balun and/or FETs simultaneously (depending on the conduction states of the FET pair) and that is piecewise description is made for the purpose of enhancing understanding of the mixer operation. Those having ordinary skill in the art in light of the description contained herein will further realize that mixer circuit 10 may be used for frequency up-conversion by applying an intermediate frequency signal to IF port 28 and extracting an up-converted RF signal at RF port 24. The RF and IF frequency bands may be distinct and non-overlapping.

Although this invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A passive reflection mixer for mixing a radio-frequency (RF) signal with a local oscillator (LO) signal comprising:

a first (Q1) and a second (Q2) FET transistor each having a gate and a drain and a source terminal, the first and second FET transistors having said gate terminals directly joined together and said source terminals directly joined together such that the first and second FET transistors are connected in series such that a current entering a drain terminal of said first FET exits said drain terminal of said second FET and a current entering a drain terminal of said second FET exits said drain terminal of said first FET;

a local oscillator input circuit having an unbalanced input port for connecting to an external local oscillator signal source, and a first two terminal output port for communicating said local oscillator signal to said joined gates and said joined sources of said first and second FET transistors such that said first and second FET transistors are both either driven on and off at the same time in response to said externally applied local oscillator signal;

a coupling network having first and second terminals of a primary port and third and fourth terminals of a secondary port, and comprising a transmission line balun having first and second transmission line components connected to divide the voltage of an incident traveling wave at said primary port equally between said first and second transmission line components, and to sum the currents of traveling waves generated by said first and second transmission line components to generate an exitant traveling wave signal at said secondary port;

said Q1 and Q2 presenting a substantially higher impedance than the impedance of said transmission line components coupling said RF signal to said FET drains when said Q1 and Q2 are OFF, and said Q1 and Q2 presenting a substantially lower impedance than the impedance of said transmission line coupling said RF signal to said FET drains when said Q1 and Q2 are ON; said RF signal being substantially completely reflected by each said Q1 and Q2 with no phase shift by said OFF Q1 and Q2, and said signal being substantially completely reflected by each said Q1 and Q2 with 180° phase shift by said ON Q1 and Q2;

a diplexer circuit having a first port for coupling to said coupling network secondary port, and including low-pass filter means for separating an intermediate frequency (IF) signal from said exitant traveling wave signal and having means for receiving a radio-frequency (RF) signal and communicating said signal to said first and second FETs;

substantially all of said RF signal incident on said first and second FETs being reflected from said first and second FETs during ON and OFF FET conduction states such that commutation of said RF signal during each half cycle of said local oscillator signal is substantially symmetrical, and such that said RF reflected signal components in said reflected wave are substantially canceled from said exitant traveling wave to generate said intermediate-frequency (IF) signal;

said coupling network first terminal being connected to said first FET transistor drain terminal, said coupling network second terminal being connected to said second FET transistor drain terminal, said third terminal being connected to a first terminal of said first diplexer port, and said fourth terminal being connected to a second terminal of said diplexer port; and a bias circuit coupleable to an external bias source for providing a direct current bias to the drains of said first and second FET transistors coupled to said coupling network so that a direct current circuit path is defined between said bias source, said coupling network, said FET transistor drain terminals, and said FET transistor source terminals.

2. The mixer in claim 1, wherein said coupling network comprises a transmission line balun.

3. The mixer of claim 2, wherein said transmission line balun comprises bifilar windings on a ferrite core.

4. The mixer of claim 2, wherein said transmission line balun has a characteristic impedances of 200 ohms at the FET side and a characteristic impedance of 50 ohms at the diplexer side.

5. The mixer of claim 1, further comprising a metal hermetic package in which all of the components of the mixer are encased.

6. The mixer of claim 1, further comprising an alumina ceramic substrate subjacent said first FET and said second FET.

7. The mixer of claim 6, wherein said first and second FET transistors comprise a GaAs MESFET MMIC device mounted to the alumina substrate.

8. The mixer of claim 1, further comprising a filter coupled between said local oscillator input circuit and said FET gates.

9. The mixer of claim 8, wherein said local oscillator input circuit includes the parallel combination of an inductor and a capacitor.

10. The mixer of claim 1, wherein said mixer operates in the frequency range between 800 MHz and 1000 MHZ.

11. The passive reflection mixer in claim 1, wherein said coupling network transforming an RF input signal impedance from substantially 50 ohms to substantially 200 ohms to thereby yield a improvement in conversion efficiency, and transforming the reflected signal in reflected reverse propagation to substantially 50 ohms.

12. A passive reflection mixer for mixing a first-frequency (FF) signal with a local oscillator (LO) signal to generate a second-frequency (SF) signal, said mixer comprising:

a first (Q1) and a second (Q2) transistor each having a gate and a drain and a source terminal, the first and second transistors having said gate terminals directly joined together and said source terminals directly joined together such that the first and second transistors are connected in series such that a current entering a drain terminal of said first FET exits said drain terminal of said second transistor and a current entering a drain terminal of said second transistor exits said drain terminal of said first transistor;

a local oscillator input circuit having an unbalanced input port for connecting to an external local oscillator signal source, and a first two terminal output port for communicating said local oscillator signal to said joined gates and said joined sources of said first and second transistors such that said first and second transistors are both either driven on and off at the same time in response to said externally applied local oscillator signal;

a coupling network having first and second terminals of a primary port and third and fourth terminals of a secondary port, and comprising a transmission line balun having first and second transmission line components connected to divide the voltage of an incident traveling wave at said primary port equally between said first and second transmission line components, and to sum the currents of traveling waves generated by said first and second transmission line components to generate an exitant traveling wave signal at said secondary port;

said Q1 and Q2 presenting a substantially higher impedance than the impedance of said transmission line components coupling said FF signal to said transistor drains when said Q1 and Q2 are OFF, and said Q1 and Q2 presenting a substantially lower impedance than the impedance of said transmission line coupling said FF signal to said transistor drains when said Q1 and Q2 are ON; said FF signal being substantially completely reflected by each said Q1 and Q2 with no phase shift by said OFF Q1 and Q2, and said signal being substantially completely reflected by each said Q1 and Q2 with 180° phase shift by said ON Q1 and Q2;

a diplexer circuit having a first port for coupling to said coupling network secondary port, and including filter means for separating said second-frequency (SF) signal from said exitant traveling wave signal and having means for receiving a first-frequency (FF) signal and communicating said signal to said first and second transistors;

substantially all of said FF signal incident on said first and second FETs being reflected from said first and second transistors during ON and OFF FET conduction states such that commutation of said FF signal during each half cycle of said local oscillator signal is substantially symmetrical, and such that said FF reflected signal components in said reflected wave are substantially canceled from said exitant traveling wave to generate said second-frequency (SF) signal; and said coupling network first terminal being connected to said first transistor drain terminal, said coupling network second terminal being connected to said second transistor drain terminal, said third terminal being connected to a first terminal of said first diplexer port, and said fourth terminal being connected to a second terminal of said diplexer port.

13. The mixer in claim 12, further comprising a bias circuit providing a direct current bias to the drains of said first and second transistors.

14. The mixer in claim 13, wherein said bias circuit is coupled to said coupling network so that a direct current circuit path is defined between said bias circuit, said coupling network, said transistor drain terminals, and said transistor source terminals.

15. The mixer in claim 12, wherein said coupling network comprises a transmission line balun.

16. The mixer of claim 15, wherein said transmission line balun comprises bifilar windings on a ferrite core.

17. The mixer of claim 12, wherein said local oscillator input port is an unbalanced port.

18. The mixer of claim 15, wherein said transmission line balun has a characteristic impedances of 200 ohms at the transistor side and a characteristic impedance of 50 ohms at the diplexer side.

19. The mixer of claim 18, further comprising a metal hermetic package in which all of the components of the mixer are encased.

20. The mixer of claim 12, further comprising an alumina ceramic substrate subjacent first transistor and said second transistor.

21. The mixer of claim 12, wherein said first and second transistors are formed in a GaAs MESFET MMIC device mounted to the alumina substrate.

22. The mixer in claim 12 wherein said first-frequency signal is a radio frequency (RF) signal, and said second-frequency signal is an intermediate-frequency (IF) signal.

23. The mixer in claim 12 wherein said first-frequency signal is an intermediate-frequency (IF) signal, and said second-frequency signal is a radio-frequency (RF) signal.

24. The passive reflection mixer in claim 12, wherein said coupling network transforming a FF input signal impedance from substantially 50 ohms to substantially 200 ohms to thereby yield a improvement in conversion efficiency, and transforming the reflected signal in reflected reverse propagation to substantially 50 ohms.

* * * * *